(12) United States Patent
Masood et al.

(10) Patent No.: US 6,888,874 B2
(45) Date of Patent: May 3, 2005

(54) SINGLE-WAVELENGTH, UNEQUAL-LENGTH-MULTI-CAVITY GRATING-OUTCOUPLED SURFACE EMITTING LASER WITH STAGGERED TUNED DISTRIBUTED BRAGG REFLECTORS

(75) Inventors: Taha Masood, Plano, TX (US); Steven Gregory Patterson, Plano, TX (US); Gary A. Evans, Plano, TX (US); Nuditha Vibhavie Amarasinghe, Richardson, TX (US)

(73) Assignee: Photodigm, Inc., Richardson, TX (US)

( * ) Notice: Subject to any disclaimer, the term of this patent is extended or adjusted under 35 U.S.C. 154(b) by 0 days.

(21) Appl. No.: 10/348,920

(22) Filed: Jan. 22, 2003

(65) Prior Publication Data

US 2004/0141540 A1 Jul. 22, 2004

(51) Int. Cl.[7] .............................. H01S 5/00; H01S 3/08
(52) U.S. Cl. ........................................... 372/96; 372/50
(58) Field of Search .............................. 372/43–50, 96, 372/97

(56) References Cited

U.S. PATENT DOCUMENTS 4,092,659 A * 5/1978 Ettenberg .................... 372/49
4,468,772 A * 8/1984 Oudar ........................... 372/8
4,894,833 A * 1/1990 Carlin ......................... 372/44
5,131,001 A * 7/1992 Carlson ....................... 372/50
5,379,318 A * 1/1995 Weber ......................... 372/96

* cited by examiner

*Primary Examiner*—Quyen Leung
(74) *Attorney, Agent, or Firm*—Duke W. Yee; Steven T. McDonald; Christopher P. O'Hagan

(57) ABSTRACT

A laser diode system is provided. The laser comprises first and second reflective gratings at each end of the laser. The laser further comprises an outcoupling grating between the first and second reflective gratings, wherein the outcoupling grating couples light out of the laser. The reflectors and outcoupling grating each have a unique wide-band reflective spectrum. A first laser cavity exists between the first and second reflective gratings. A second laser cavity exists between the first reflective grating and the outcoupling grating. A third laser cavity exists between the second reflective grating and the outcoupling grating, and a fourth laser cavity exists with in the outcoupling region. The overlap of reflective spectra determine the lasing wavelengths that reach resonance within each cavity. Wavelengths resonant in one cavity are suppressed in the others unless a wavelength is resonant in all cavities. This matching of mode intensities causes the outcoupled beam to be confined to a single wavelength.

9 Claims, 3 Drawing Sheets

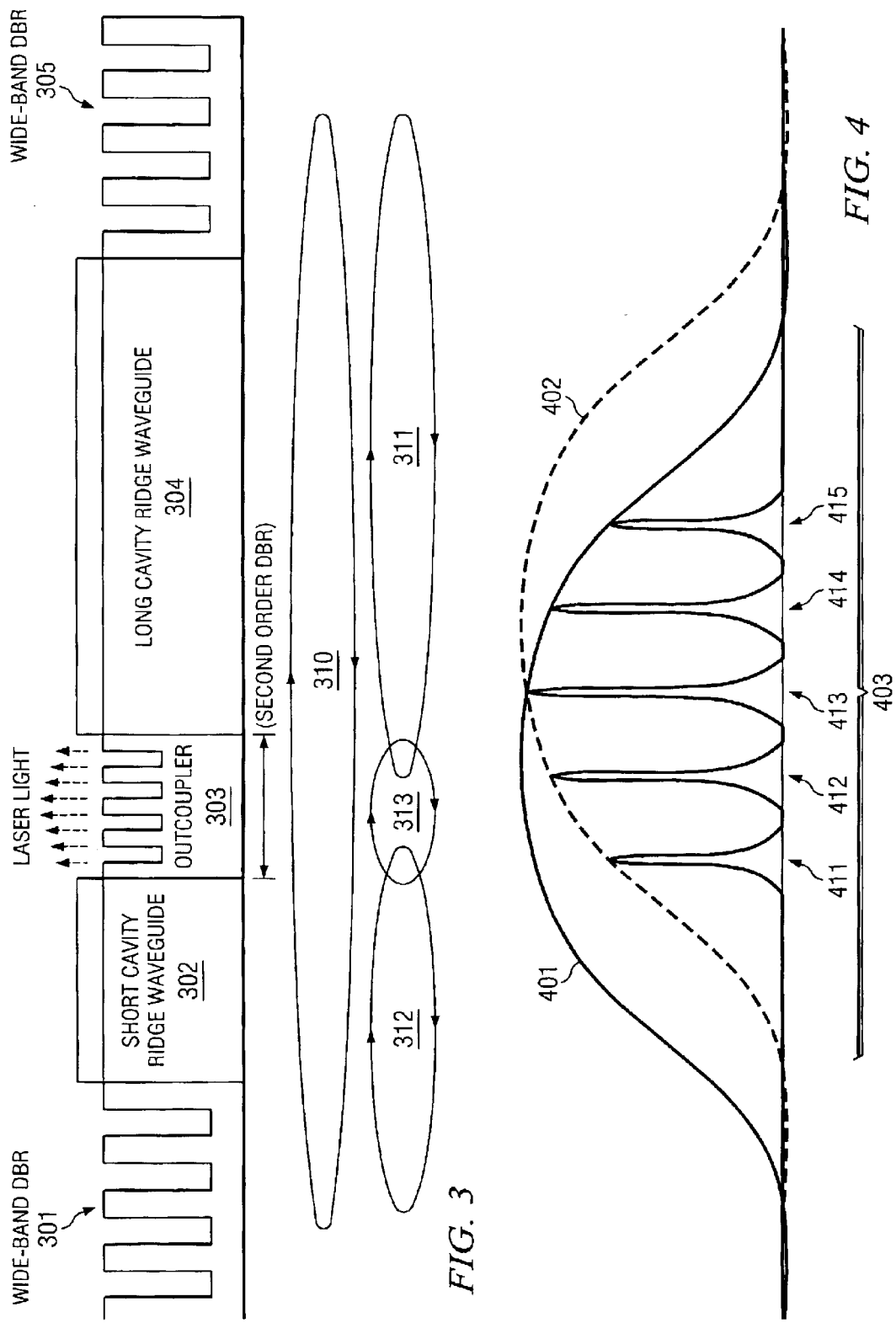

SINGLE-WAVELENGTH, UNEQUAL-LENGTH-MULTI-CAVITY GRATING-OUTCOUPLED SURFACE EMITTING LASER WITH STAGGERED TUNED DISTRIBUTED BRAGG REFLECTORS

BACKGROUND OF THE INVENTION

1. Technical Field

The present application relates to laser diodes, and more particularly to a multi-cavity laser with unequal cavity lengths and stagger tuned Bragg reflector configuration for single mode operation.

2. Description of the Related Art

Transmission of light through waveguides has been pursued for many types of communications applications. Light signals offer many potential advantages over electronic signals. Light sources are commonly created from semiconductor devices, and include semiconductor devices such as LEDs (Light Emitting Diodes) and LDs (Laser Diodes).

Optical fiber is the most commonly used transmission medium for light signals. A single fiber is capable of carrying several different modulated signals within it at one time. For instance, wavelength division multiplexing divides the used bandwidth of the fiber into different channels (each channel containing a small range of wavelengths) and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRS) located outside the pumped region.

In conventional DFB and DBR lasers, light is removed through an end facet and the output beams have dimensions entirely controlled by the vertical (i.e., normal to the surface) (x) and lateral (y) size and the composition of the guiding structure. Such output beams typically have too great a divergence for effective coupling to optical fibers, or for other applications requiring beams with low divergence angles.

Beam dimensions (in at least one direction) larger than that available from laser facets may be obtained by using a Bragg grating to couple light out of the waveguide normal (or at certain fixed angles) to the waveguide surface. So called second order Bragg gratings have a period equal to the wavelength of light of the guided mode. The second grating order of such a grating reflects some of the light back in the waveguide plane while the first order couples some of the light normal to the plane. So called first order (Bragg) gratings have a period equal to one half the wavelength of light in the guided mode, reflect light in the waveguide plane, and do not couple light out of the waveguide. First, second, and third order (etc.) gratings are sometimes referred to as being in resonance. A non-resonant grating couples light out of the waveguide at an angle to the normal and does not reflect any light in the waveguide plane.

U.S. Pat. No. 5,970,081 to Hirayama et al. appears to show a laser with a distributed feedback (DFB) grating of second order or higher that claims to obtain a Gaussian shaped output beam by narrowing the waveguide or using a chirped grating at the outcoupling portion. They do not seem to recognize that by so doing the resonant wavelength of the grating is altered along the length of the narrowing or chirping. This would be expected to result in an output which will fan in angle along the longitudinal direction rather than produce a simple Gaussian intensity variation emitted normal to the plane as claimed. They do not define the beam shape in the lateral direction. In all versions they choose second order outcoupling gratings which, absent a narrowing waveguide or chirp, would emit light perpendicular to the surface of the laser waveguide.

U.S. Pat. No. 4,006,432 to Streifer et al. appears to show a grating out-coupled surface emitting DFB laser. The grating period may be chosen to be either resonant or not.

A paper by Bedford, Luo, and Fallahi titled Bow-Tie Surface-Emitting Lasers (IEEE Photonics Technology Letters, Vol. 12, No. 8, August 2000) appears to show a DBR laser with curved second order grating at the ends to couple light out of the waveguide. The same gratings are used for outcoupling and for reflecting the light within the waveguide. They mention the use of non-resonant gratings in conjunction with reflector gratings if emission at other than the direction normal the waveguide plane is desired. The paper appears to show a flared resonator region which allows symmetric outcoupling from both ends of the laser. This facilitates two outputs that are coherent with one another, with emission in the same direction. Such a device is meant to alleviate the complications of controlling the relative phase between the two emitters.

The Tiberio article (Facetless Bragg reflector surface-emitting AlGaAs/GaAs lasers . . . , J. Vac. Sci. Technol., B9(6), 1991) appears to show a surface emitting laser diode that uses first order reflective gratings and either second order (or non-resonant) gratings for outcoupling. Thus, depending on the chosen grating period, the outcoupled beam can be normal or at an angle to the surface.

U.S. Pat. No. 6,064,783 to Congden appears to show a DBR laser with a grating assisted waveguide coupler that couples light from the laser waveguide to a parallel fiber-like glass waveguide for later coupling to a fiber. Several different lasers are coupled to similar fiber-like glass waveguides in the figures. The fiber axis is parallel to the laser waveguides. This reference mentions that this model is easily attached to a fiber through "butt coupling." The grating acts as a Quasi Phase Matching element to couple the light from the laser waveguide to the fiber-like glass waveguide.

A shallow first-order DBR needs to be long in order to achieve high reflectivity. Long length, passive, unpumped DBR regions can cause saturable absorption (which degrades laser performance) if the DBR selected lasing wavelength is on the short side of the laser's Fabry-Perot gain spectrum peak. Furthermore, as the beam propagates in a long length DBR section it diverges, resulting in a large fraction of the reflected light being lost in the substrate and not reflected back into the ridge guide. Introducing a confinement ridge in the DBR region to limit the divergence problem adds more processing steps, which further complicates the manufacture of such GSE lasers.

Therefore, it would be desirable to have a laser design that avoids saturable absorption and beam divergence, without the manufacturing complications of long-length, shallow DBR laser designs.

SUMMARY OF THE INVENTION

The present system provides a laser diode system. The laser comprises first and second reflective gratings at each end of the laser, wherein each reflector has a unique wideband reflective spectrum. The laser further comprises an outcoupling grating between the first and second reflective gratings, wherein the outcoupling grating couples light out of the laser, and wherein the outcoupling grating has a third reflective spectrum covering a wide band of light wavelengths, wherein the third reflective spectrum is narrower that the first and second reflective spectra. A first laser cavity exists between the first and second reflective gratings. A second laser cavity exists between the first reflective grating and the outcoupling grating, wherein the second laser cavity is shorter than the first laser cavity. A third laser cavity exists between the second reflective grating and the outcoupling grating, wherein the third laser cavity is shorter than the second laser cavity. A fourth laser cavity exists between the discontinuity in the ridge waveguide in the outcoupling region. The overlap of reflective spectra determine the lasing wavelengths that reach resonance within each cavity. Wavelengths resonant in one cavity are suppressed in the others unless a wavelength is resonant in all cavities. This matching of mode intensities causes the outcoupled beam to be confined to a single wavelength.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1b depicts a top view of the GO-SEL depicted in FIG. 1a;

FIG. 3 depicts a schematic diagram illustrating a multi-cavity laser in accordance with the present invention;

FIG. 4 depicts a diagram illustrating mode matching for the wide-band DBRs in accordance with the present invention.

DETAILED DESCRIPTION

Figure 1A:
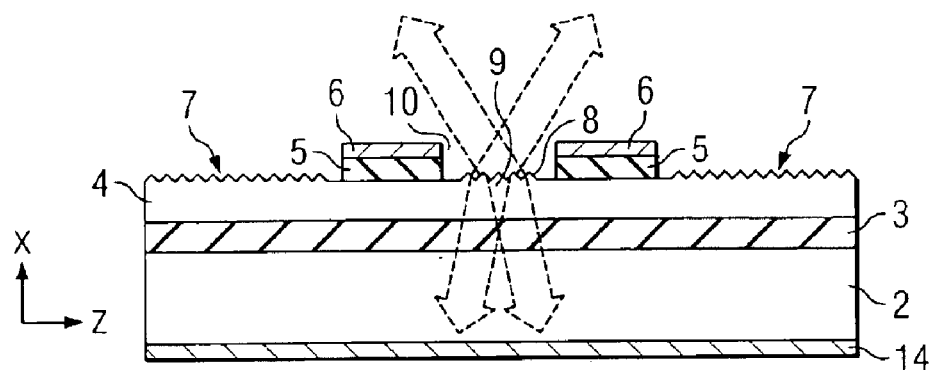
FIG. 1a depicts a cross sectional schematic diagram illustrating a grating-coupled surface emitting laser (GO-SEL) in accordance with the prior art.

The numerous innovative teachings of the present application will be described with particular reference to the presently preferred embodiment (by way of example, and not of limitation).

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order) are used. In such arrangements, the feedback grating depth or strength is varied in the y and z directions so that both the loss and the feedback from the grating help to stabilize the laser mode. For example, the first order lateral mode will be stabilized if the grating strength is varied so that the feedback varies like a Gaussian. This is accomplished by forming the grating so that its strength varies as $$1-exp[-(y/\omega)^2]$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence.

In the case of exactly or near normal outcoupling, there can be significant in-plane reflection that may (or may not) adversely affect the performance of the laser.

Referring now to the figures, and in particular to FIG. 1a, a cross sectional schematic diagram illustrating a grating-coupled surface-emitting laser (GO-SEL) is depicted in accordance with the prior art. FIG. 1a is taken to show the x–z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6, which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave, which may be considered formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. The degree to which the unwanted modes are suppressed is called the side-mode suppression ratio.

The outcoupling grating 8 (sometimes referred to herein as OC grating, or OCG) is a surface relief grating with period chosen to couple light at desired angles from the grating plane. It is located at an aperture on the surface of the device. The outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
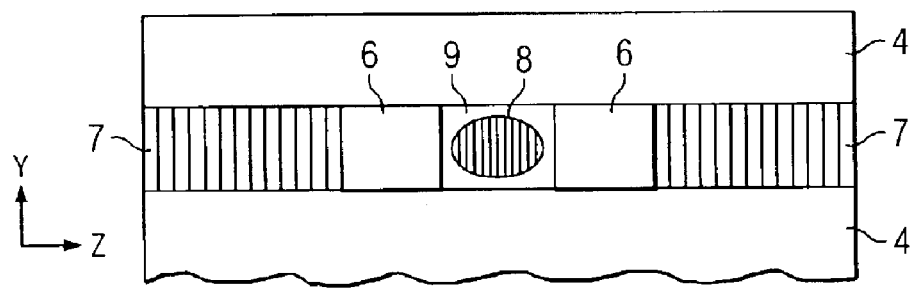

FIG. 1b shows a top view of the GO-SEL depicted in FIG. 1a. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Figure 2:
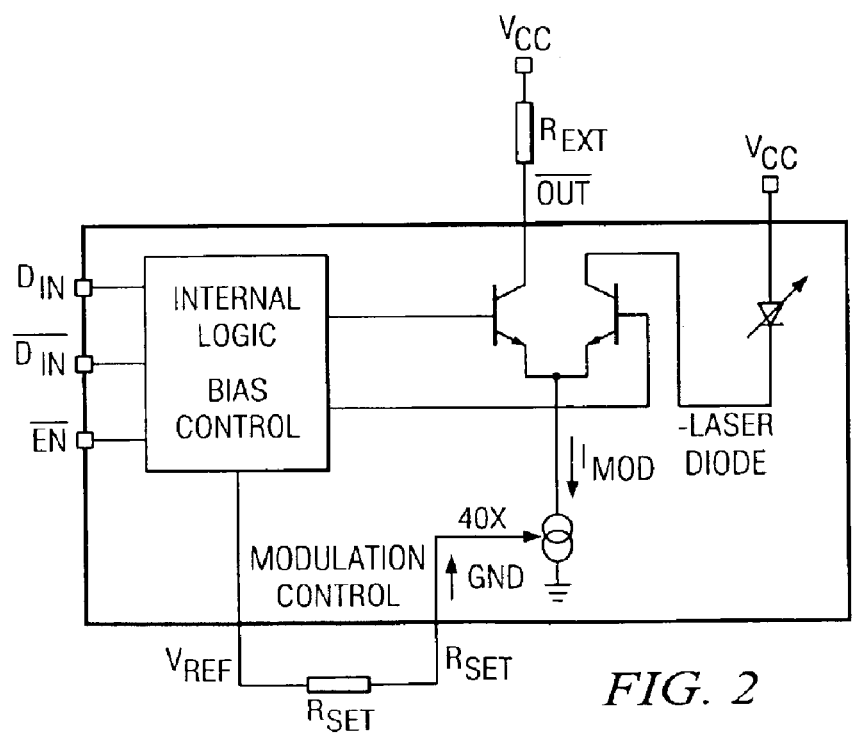
FIG. 2 depicts a schematic diagram illustrating a higher level circuit integration on the same chip as the GO-SEL diode in accordance with the present invention.

Referring to FIG. 2, a schematic diagram illustrating a higher level circuit integration on the same chip as the GO-SEL diode is depicted in accordance with the present invention. In this example, laser driver and control electronics are integrated. Din and Din-bar are differential data inputs and EN is the chip enable. Internal logic and BIAS control is used to center the data to the inputs of the driver pair and to provide a $V_{ref}$ output. This output is used with $R_{set}$ to control the current source or modulation current $I_{mod}$ which sets the output current to the grating outcoupled laser diode. The resistor $R_{ext}$ is external to minimize the power dissipation capacity, both $R_{ext}$ and $R_{set}$ may be integrated as well.

Referring to FIG. 3, a schematic diagram illustrating a multi-cavity laser is depicted in accordance with the present invention. The laser comprises deep, short, wide-band DBRs 301 and 305 at both ends of the laser. An outcoupling grating 303 divides two active regions 302 and 304 and is placed between the two wide-band DBRs 301 and 305 such that the two active regions 302 and 304 are of unequal lengths. The deep outcoupling grating 303 couples light out of the laser cavity and also serves as a second order wide-band reflector. The active regions 302 and 304 are optically coupled gain regions with electrical contacts for supplying current.

In the present embodiment, the laser has four optically coupled cavities. A cavity is defined as the regions between two reflecting parallel mirrors. The longest cavity 310 exists between the two wide-band DBRs 301 and 305. The next longest cavity 311 exists between the deep outcoupler grating 303 and the wide-band DBR 305 at the other end of the long gain region 304. A third cavity 312 exists between the outcoupler grating 303 and the wide-band DBR 301 at the other end of the short gain region 302. A fourth cavity 313 is defined by the discontinuity in the ridge waveguide in the outcoupler region 303.

The position of the resonant modes (wavelengths) is fixed in each cavity, which is governed by the effective length of that cavity. The wavelengths of light resonant in one cavity will be suppressed in another, unless the wavelength in question is resonant in all cavities. This matching of mode intensities across the cavities 310–313 causes the outcoupled beam to be confined to a single wavelength, which will lase at the peak of the laser's gain profile.

Referring now to FIG. 4, a diagram illustrating mode matching for the wide-band DBRs is depicted in accordance with the present invention. FIG. 4 illustrates mode matching in the long cavity 310 that exists between the wide-band DBRs 301 and 305. The deep, short, wide-band DBRs 301 and 305 at either end of the laser are ~100% reflective to a wide band of Fabry-Perot frequencies. The grating periods of these DBRs 301 and 305 can be chosen such that the overlap 403 of their respective reflectivity spectra 401 and 402 will only allow a narrow band of lasing wavelengths to reach resonance in the laser cavity 310. In the example in FIG. 4, the overlap 403 of the reflectivity spectra 401 and 402 allows only five lasing wavelengths 411–415 to reach resonance. The number of Fabry-Perot wavelengths in resonance can be larger or smaller depending on the size of the overlap between the reflectivity spectra, five wavelengths are used in the present example merely for ease of illustration. Tuning the reflectivity spectra of wide-band DBRs so that only one wavelength is selected is difficult to achieve in a manufacturing environment, especially when the mode spacing between modes inside the cavity is small. (Mode spacing gets smaller as the cavity length increases.) Therefore, the present invention allows for the overlap to be wide enough to accommodate a small subset of Fabry-Perot modes around the gain peak.

Multi-coupled cavities making up the laser further confine the light beam to a single wavelength by suppressing wavelengths that are not resonant in all cavities. As stated above, light wavelengths that are resonant in one cavity are suppressed by the others, unless the wavelength is resonant in all cavities. If the cavity lengths are chosen such that, in general, wavelengths do not match (except for one), then the beam would be confined to a single wavelength: a matching mode near the peak of the laser's gain profile.

Figure 5:
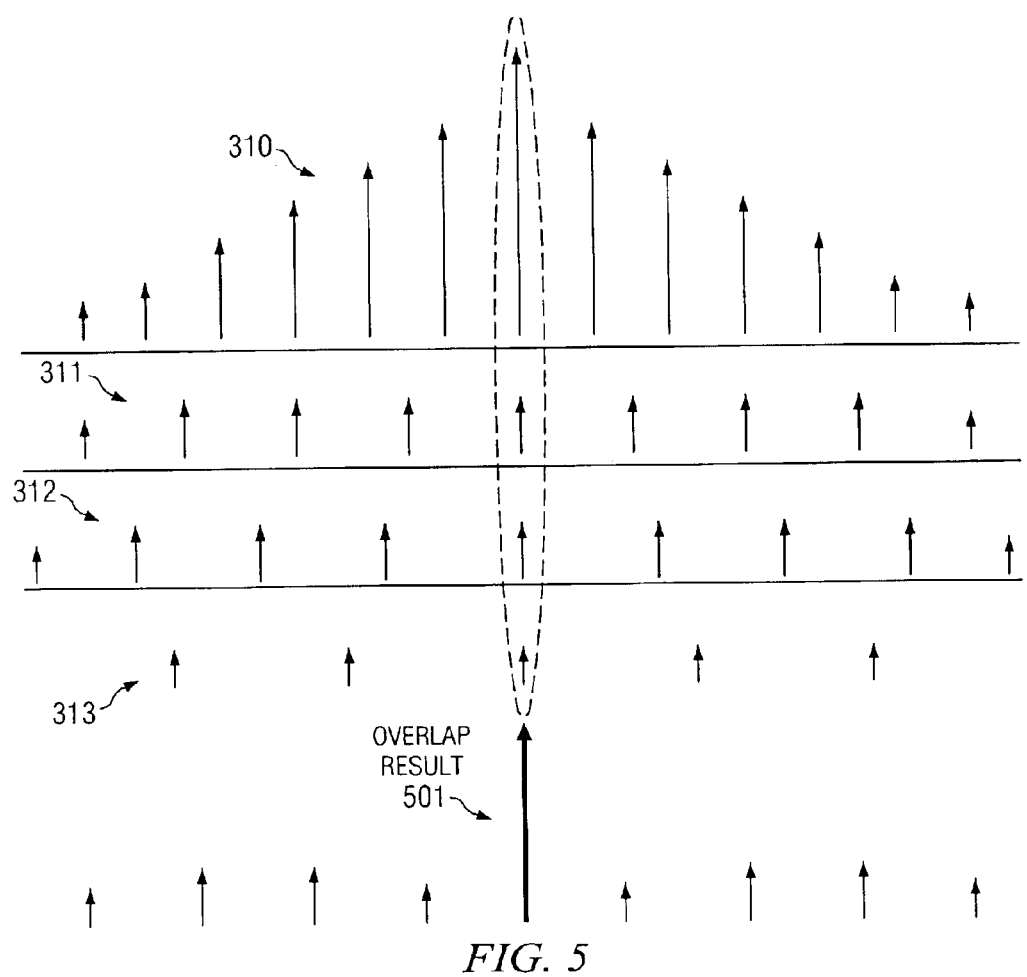
FIG. 5 depicts a diagram illustrating mode matching between all four cavities in the laser in accordance with the present invention.

Referring to FIG. 5, a diagram illustrating mode matching between the four cavities of the laser is depicted in accordance with the present invention. Each row of arrows represents the lasing wavelengths that reach resonance within each cavity 310–313. As can be seen in FIG. 5, as the length of the cavity becomes shorter, the space between the resonant lasing wavelengths becomes greater and fewer wavelengths reach resonance. For example, because cavity 312 is shorter than cavity 311, there is greater spacing between the lasing wavelengths in cavity 312 than there is between the lasing wavelengths in cavity 311.

Due to the different cavity lengths, each cavity 310–313 has a unique set of lasing wavelengths. The cavity lengths are chosen such that only one lasing wavelength 510 is common to the bandwidth spectra of all four cavities 310–313. All other lasing wavelengths are suppressed. Therefore, since wavelength 501 is the only lasing wavelength that overlaps all four cavities 310–313, it is the only wavelength present in the beam emitted through the outcoupler grating 303.

This multi-cavity GO-SEL is a smaller device compared to earlier symmetric GO-SEL devices, which have longer DBRs are both or one end of the laser cavity. This smaller size improves the device aspect ratio and increases the number of devices that can be packed on a single wafer.

A shallow first-order DBR needs to be long in order to achieve high reflectivity. Long length, passive, unpumped DBR regions can cause saturable absorption (which degrades laser performance) if the DBR selected lasing wavelength is on the short side of the laser's Fabry-Perot gain spectrum peak. Furthermore, as the beam propagates in a long length DBR section it diverges, resulting in a large fraction of the reflected light being lost in the substrate and not reflected back into the ridge guide. Introducing a confinement ridge in the DBR region to limit the divergence problem adds more processing steps, which further complicates the manufacture of such GSE lasers.

By contrast, short, wide-band, DBR-based, single-wavelength, multi-cavity GSE lasers avoid all of the problems discussed above associated with long-length, shallow DBR lasers. This is because singe-wavelength, multi-cavity GSE lasers lase at wavelengths at or near the gain peak (where no saturable absorption occurs, though there may still be excitonic absorption), and beam divergence is not an issue because of the short DBR region(s).

Since the GSE laser as described lases at the gain peak it will have better temperature performance than a laser with a passive long first-order DBR region. The wavelength selected by a first-order DBR does not follow the shift in the gain peak as the temperature increases or decreases. Thus, the performance of the laser can degrade at temperatures at which the DBR-selected wavelength does not match the laser's gain peak.

Short length, deep DBRs at both ends of the cavity reduce the effective length of the laser. This results in improved dynamic response characteristics of the laser device, which then can be modulated at higher frequencies compared to long length DBR devices.

The following background publications provide additional detail regarding possible implementations of the disclosed embodiments, and of modifications and variations thereof, and the predictable results of such modifications. All of these publications are hereby incorporated by reference: "Surface Emitting Semiconductor Lasers and Arrays," Ed. Evans and Hammer, Academic Press, 1993; "Research Toward Optical Fiber transmission Systems Part 1," Proc. IEEE, 61, 1703–1751, December 1973; "Optimized Couplers Between Junction lasers and Single Mode Fibers," Hammer, Neil, RCA laboratories, Princeton, N.J., Final Report, 31 Aug. 1981–31 Jan. 1983; "Observations and Theory of High Power Butt Coupling to LiNbO$_3$-type waveguides," Hammer and Neil, IEEE J. Quantum Electronics, QE-18, 1751–1758, October 1982; "Laser Diode End Fire Coupling into Ti:LiNbO$_3$ waveguides," Appl, Optics, 18, 2536–2537, August 1979.

As will be recognized by those skilled in the art, the innovative concepts described in the present application can be modified and varied over a tremendous range of applications, and accordingly the scope of patented subject matter is not limited by any of the specific exemplary teachings given.

The outcoupling element in the disclosed embodiments can be a grating as described, or a holographic optical element, a lens, or any other outcoupling device. For example, a beam splitter properly positioned can also couple light out of the cavity. Blazed gratings may also be used. Circular gratings (which produce a fanned light output) can also be used in some applications. The innovative structures can also include DFB gratings rather than DBRs to reflect cavity mode light.

The waveguide structure can be of different forms, for example, a ridge waveguide or a buried heterojunction.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A surface emitting laser diode system, comprising:
   first and second reflective gratings at either end of the laser, wherein the first and second reflective gratings each have a unique reflective spectrum covering a broad band of light wavelengths;
   an outcoupling region between the first and second reflective gratings, wherein the outcoupling region has a grating that couples a light beam out of the laser, and wherein the outcoupling grating has a unique reflective spectrum covering a wide band of light wavelengths, wherein the reflective spectrum of the outcoupling grating is narrower than the reflective spectra of the first and second reflective gratings;
   a first laser cavity between the first and second reflective gratings;
   a second laser cavity between the first reflective grating and the outcoupling grating, wherein the second laser cavity is shorter than the first laser cavity;
   a third laser cavity between the second reflective grating and the outcoupling grating, wherein the third laser cavity is shorter than the second laser cavity; and
   a fourth laser cavity within the outcoupling region, wherein the fourth laser cavity is shorter than the third laser cavity;
   wherein each laser cavity allows a unique set of lasing wavelengths to reach resonance, wherein the lasing wavelengths that reach resonance in each cavity are determined by the length of that cavity;
   wherein only one lasing wavelength is resonant in all four cavities, and wherein said single wavelength is the only wavelength in the beam outcoupled from the laser.

2. The laser diode system according to claim 1, further comprising:
   a first gain region between the first reflective grating and the outcoupling grating, wherein the first gain region is equal in length to the first laser cavity; and
   a second gain region between the second reflective grating and the outcoupling grating, wherein the second gain region is equal in length to the second laser cavity;
   wherein the first and second gain regions have electrical contact for supplying current.

3. The laser diode system according to claim 1, wherein the first and second reflective gratings are distributed Bragg reflectors.

4. The laser diode system according to claim 3, wherein the first and second reflective gratings are third order distributed Bragg reflectors.

5. The laser diode system according to claim 3, wherein the first and second reflective gratings are fifth order distributed Bragg reflectors.

6. The laser diode system according to claim 1, wherein the outcoupling grating is a second order distributed Bragg deflector.

7. A surface emitting laser diode system, comprising:
   a first reflective grating at a first end of the system, wherein the first reflective grating has a first reflectivity spectrum of a first set of light wavelengths; and
   a second reflective grating at a second end of the system opposite the first end, wherein the second reflective grating has a second reflectivity spectrum of a second set of light wavelengths different than the first set of light wavelengths, wherein the first reflectivity spectrum and the second reflectivity spectrum are offset such that an overlap in the first reflectivity spectrum and the second reflectivity spectrum results in a resonant band of lasing wavelengths narrower than a respective band of each the first reflectivity spectrum and the second reflectivity spectrum.

8. The surface emitting laser diode system of claim 7, further comprising:
   an outcoupling region between the first reflective grating and the second reflective grating.

9. The surface emitting laser diode system of claim 8, wherein the outcoupling region further comprises an outcoupling grating having a reflectivity spectrum with a reflectivity spectrum different than the first reflectivity spectrum and the second reflectivity spectrum.

* * * * *